(12) United States Patent
Williams et al.

(10) Patent No.: US 6,172,542 B1
(45) Date of Patent: Jan. 9, 2001

(54) SELECTABLE SINGLE ENDED-TO DIFFERENTIAL OUTPUT ADJUSTMENT SCHEME

(75) Inventors: Timothy J. Williams, Bellevue; Warren S. Snyder, Snohomish, both of WA (US)

(73) Assignee: Cypress Semiconductor Corp., San Jose, CA (US)

( * ) Notice: Under 35 U.S.C. 154(b), the term of this patent shall be extended for 0 days.

(21) Appl. No.: 09/192,715

(22) Filed: Nov. 16, 1998

(51) Int. Cl.[7] .............................. H03H 11/16; H03H 11/26
(52) U.S. Cl. .......................... 327/239; 327/245; 327/270; 327/259
(58) Field of Search .................................. 327/237, 239, 327/247, 250, 251, 256–259, 269, 270, 263, 264, 266, 170, 171, 392–395, 415, 416, 108, 111, 112, 243, 245

(56) References Cited

U.S. PATENT DOCUMENTS

| | | | |
|---|---|---|---|
| 5,012,141 | * | 4/1991 | Tomisawa .............................. 327/394 |
| 5,140,174 | * | 8/1992 | Meier et al. ............................ 327/171 |
| 5,751,176 | * | 5/1998 | Sohn et al. ............................. 327/257 |
| 5,977,809 | * | 11/1999 | Wang et al. ............................ 327/259 |

* cited by examiner

*Primary Examiner*—Toan Tran
(74) *Attorney, Agent, or Firm*—Christopher P. Maiorana, P.C.

(57) ABSTRACT

A circuit comprising an input circuit and an adjustable delay. The input circuit may be configured to generate a differential signal in response to a single ended signal. The adjustable delay may be configured (i) delay or not change a rising edge or (ii) delay or not change a falling edge of a first portion of the differential signal. A second adjustable delay may be configured (i) delay or not change a rising edge or (ii) delay or not change a falling edge of a second portion of the differential signal. The differential signal may be presented to an output buffer in a Universal Serial Bus device. The present invention may also include a squaring circuit that may be configured to improve the differential alignment between the first and second portions of the differential signal.

19 Claims, 2 Drawing Sheets

SELECTABLE SINGLE ENDED-TO DIFFERENTIAL OUTPUT ADJUSTMENT SCHEME

FIELD OF THE INVENTION

The present invention relates to crossover adjustment circuits generally and, more particularly, to an output crossover adjustment circuit that may be used to provide edge compensation in a device, such as a universal serial bus device.

BACKGROUND OF THE INVENTION

The universal serial bus (USB) has a variety of operating modes that allow a number of computer peripherals to be connected to a generic port. One of the modes of a USB device is a high speed mode. One design criteria involved with USB devices is that the crossover voltage of the differential signals must be tightly controlled. As a result, the USB device must be designed to provide the proper crossover at the output across voltage, temperature, and device processing variations.

A universal serial bus (USB) driver may take a single data and have an increment and a decrement signal. The increment and decrement signals are exclusive of each other. The signals cause the edge relationship of the two outputs to either lead/lag or lag/lead. The signals cause the entire waveform to either lead or to lag without distorting the waveform. Conventional approaches would change the rise or fall time of the signals in addition to varying the delay. These rise/fall time distortions can cause problems in the output driver stages. An example of a circuit that delays a single edge may be found in co-pending application "METHODS, CIRCUITS AND DEVICES FOR IMPROVING CROSSOVER PERFORMANCE AND/OR MONOTONICITY, AND APPLICATIONS OF THE SAME IN A UNIVERSAL SERIAL BUS (USB) LOW SPEED OUTPUT DRIVER", Ser. No. 08/934,933, Filed Sep. 22, 1997, which is hereby incorporated by reference in its entirety.

Alternately, two separate drivers could be implemented. However, this would be at the expense of additional associated overhead. Each universal serial bus device has two outputs, a plus output and a minus output. A driver circuit implementing separate drivers would have to be implemented, at a minimum, at each of the plus and minus outputs. In an application that provides a number of universal serial bus outputs on a single device, the number of instances that a driver would have to be duplicated increases accordingly. As a result, it is desirable for the number of components in a driver circuit be kept to a minimum in order to reduce the overall area required to implement the plurality of required buffers at the various outputs.

SUMMARY OF THE INVENTION

The present invention concerns a circuit comprising an input circuit and an adjustable delay. The input circuit may be configured to generate a differential signal in response to a single ended signal. The adjustable delay may be configured (i) to delay or not change a rising edge or (ii) delay or not change a falling edge of a first portion of the differential signal. A second adjustable delay may be configured to (i) delay or not change a rising edge or (ii) delay or not change a falling edge of a second portion of the differential signal. The differential signal may be presented to an output buffer in a Universal Serial Bus device. The present invention may also include a squaring circuit that may be configured to improve the differential alignment between the first and second portions of the differential signal.

The objects, features and advantages of the present invention include providing an output buffer that includes a trim circuit that may move a particular edge forward or backwards so the crossover voltage can be locked in.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may provide edge compensation to lock in or adjust crossover points of an output signal in a device, such as USB device operating in a high speed mode, by implementing one or more adjustable delay elements that may provide waveform compensation to either a positive or a negative edge of the output signal. The compensation may delay either the rising or falling edge of the waveform. The compensation does not generally change the overall shape of the waveform. The present invention may present a differential complementary output using a single driver.

Figure 1:
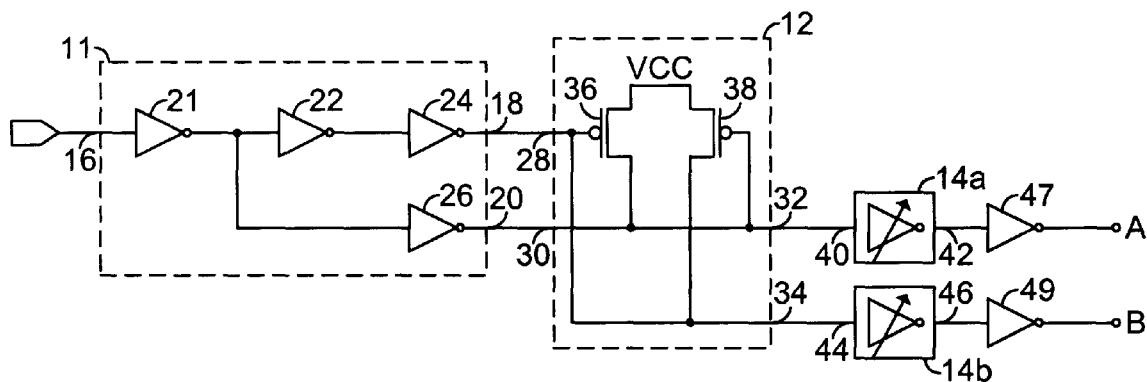
FIG. 1 is a block diagram of a preferred embodiment of the present invention.

Referring to FIG. 1, a block diagram of a circuit 10 is shown in accordance with a preferred embodiment of the present invention. The circuit 10 generally comprises an input section (or circuit) 11, a squaring section (or circuit) 12, an adjustable delay section (or circuit) 14a and an adjustable delay section (or circuit) 14b. The input section 11 may have an input 16 that may receive a single ended input signal and an output 18 and an output 20 that may present a differential output signal. The input section 11 generally comprises a device 21, a device 22, a device 24 and a device 26. The device 24 may present a first portion of the differential output at the output 18 and the device 26 may present a second portion of the differential output at the output 20. The devices 21, 22, 24 and 26 may be implemented as inverters. The device 21 generally inverts the signal received at the input 16. The device 22 and the device 26 generally invert the signal received from the device 21. The device 24 generally inverts the signal received from the device 22. As a result, the signal presented at the output 18 is generally 180° out of phase with the signal presented at the output 20.

The second section 12 may have an input 28 that may receive the signal presented at the output 18, an input 30 that may receive the signal presented at the output 20, an output 32, and an output 34. The squaring section 12 generally comprises a device 36 and a device 38. The device 36 may be connected between a supply voltage (e.g., VCC) and the input 30. The device 36 may have a control gate that may be connected to the input 28. The device 38 may be connected between the supply voltage VCC and the output 34. The device 38 may have a control gate connected to the output 32. The device 36 and the device 38 may be implemented as CMOS devices, in particular PMOS devices. However, NMOS devices may be implemented, connected between the outputs 32 (or 34) and Vss. The squaring section 12 may provide an improved differential alignment between the signals received at the inputs 28 and 30.

The first adjustable delay section 14a may have an input 40 that may receive the signal from the output 32 and an output 42 to present an adjusted signal. The output 42 may be presented to an output inverter 47. The adjustable delay section 14b may have an input 44 that may receive a signal from the output 34 of the squaring section 12 and an output 46 that may present an adjusted signal. The output 46 may be presented to an output inverter 49. The output inverters 47 and 49 may provide an effectively constant rise/fall time waveform even if the adjustable delay sections 14a and 14b are varied.

Figure 2:
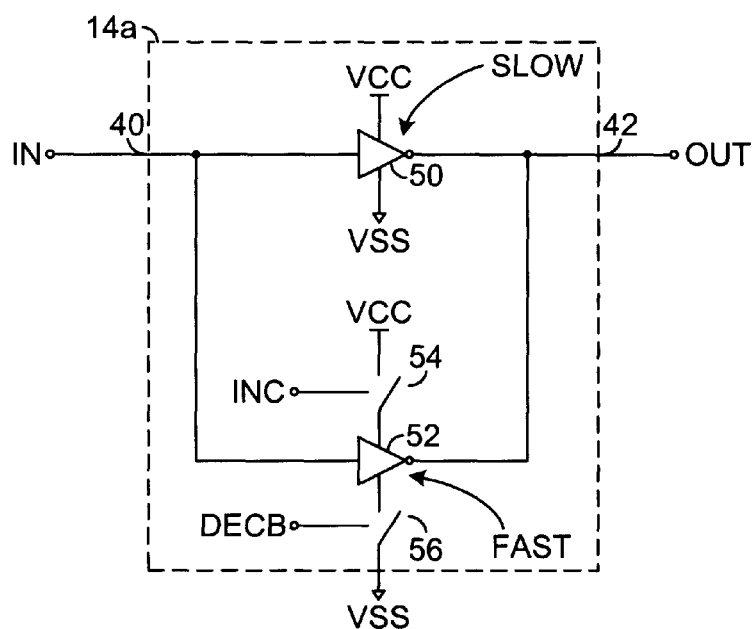
FIG. 2 is a more detailed diagram of the compensation circuit of FIG. 1.

Referring to FIG. 2, a more detailed diagram of the adjustable delay section 14a is shown. The adjustable delay section 14b may be implemented similarly to the adjustable delay section 14a. The adjustable delay section 14a may comprise a device 50 and a device 52. The device 50 may receive a signal IN received at the input 40 and may present a portion of the signal OUT presented at the output 42. The device 52 may also receive the signal IN and may also contribute to the signal OUT. The device 50 may be implemented as a slow device and the device 52 may be implemented as a fast device. The device 50 may be coupled between the supply voltage VCC and a virtual ground (e.g., VSS). The device 52 may also be connected between the supply voltage VCC and the virtual ground VSS with the addition of a switch 54 and a switch 56. The switch 54 may connect the device 52 to the supply voltage VCC when a control signal (e.g., INC) is presented to the switch 54. The device 52 may be connected to the virtual ground VSS when a second control signal (e.g., DECB) is presented to the switch 56. In general, when the signal INC is presented to the switch 54, the rising edge of the signal OUT is sped up. Additionally, when the signal DECB is presented to the switch 56, the falling edge of the signal OUT is sped up. By controlling the rising edge and falling edge of the signal OUT, a proper crossover can be maintained between the output A and the output B.

Figure 3:
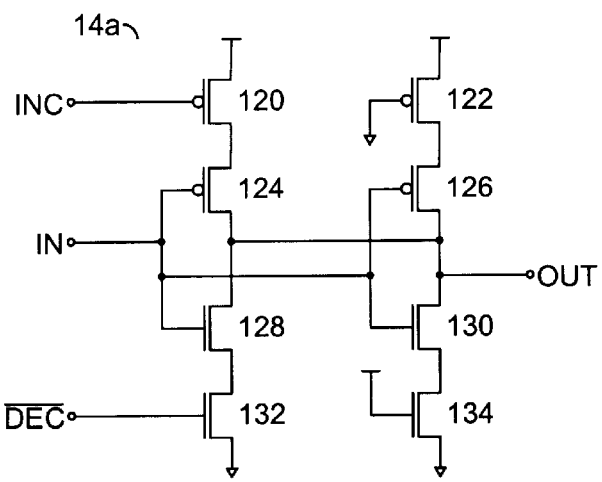
FIG. 3 is a circuit diagram of the inverter of FIG. 2.

Referring to FIG. 3, a more detailed diagram of the adjustable delay circuit 14a is shown. An adjustable delay section 14a may comprise a transistor 120, a transistor 122, a transistor 124, a transistor 126, a transistor 128, a transistor 130, a transistor 132, and a transistor 134. The transistors 120, 122, 124 and 126 may be implemented, in one example, as PMOS transistors and the transistors 128, 130, 132 and 134 may be implemented, in one example, as NMOS transistors. The gates of the transistors 124, 126, 128 and 130 may receive the input signal IN. The gate of the transistor 122 may be coupled to ground. The gate of the transistor 134 may be coupled to a supply voltage. The signal OUT is generally presented from a node between the drain of the transistor 126 and the source of the transistor 130 and the drain of the transistor 124 and the source of the transistor 128. The gate of the transistor 120 generally receives the control signal INC and the gate of the transistor 132 generally receives the control signal DECB.

Figure 4A:
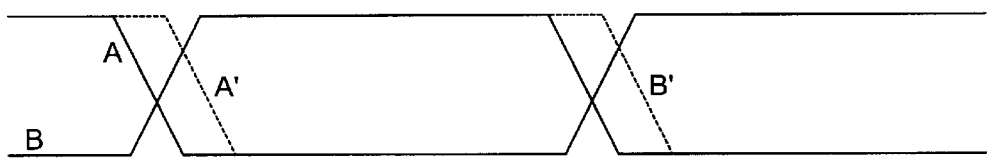
FIGS. 4a and 4b are timing diagram illustrating the adjustment to the output waveforms provided by the present invention.
Figure 4B:
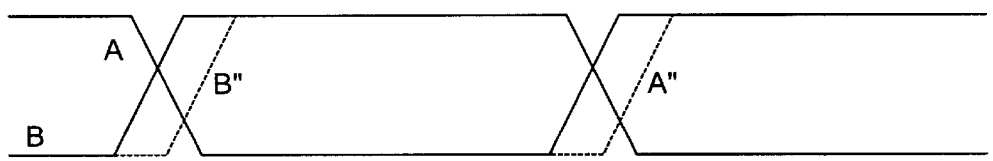

Referring to FIG. 4a, a timing diagram of the outputs A and B is shown without compensation (e.g., A and B) and with compensation (e.g., A' and B'). Referring to FIG. 4b, a timing diagram of the outputs A and B is shown without compensation (e.g., A and B) and with compensation (e.g., A" and B"). FIG. 4a illustrates delaying the falling edges of both the signal A and the signal B to move the crossover point higher. FIG. 4b illustrates delaying the rising edge of the signal A and the signal B to move the crossover point lower. If the different edges of the signals A and B have different edge rates, it may become desirable to delay the rising edge of only one of the signals (e.g., the signal A) to provide proper crossover performance.

Figure 5:
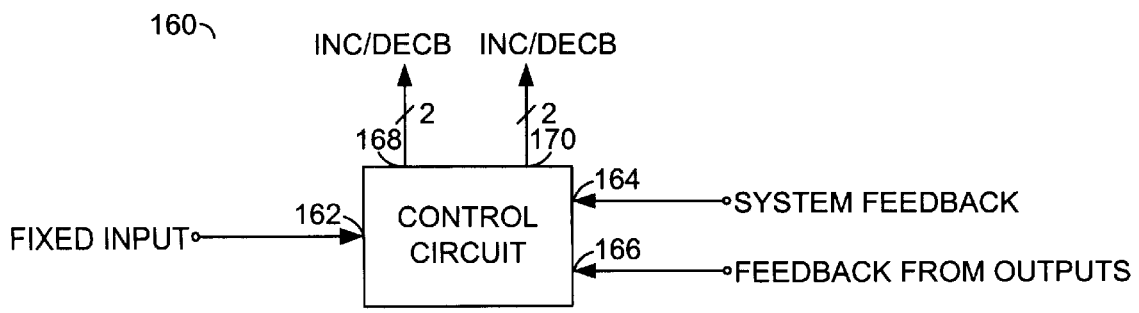
FIG. 5 is a block diagram illustrating a control circuit that may be used with the present invention.

Referring to FIG. 5, a logic block (or circuit) 160 is shown. The circuit 160 generally comprises an input 162, an input 164, and input 166, an output 168 and an output 170. The input 162 may receive a signal from an external device (not shown) that may be used to calibrate the circuit 10 after fabrication to adjust for process variations. The input 164 may receive a signal that may be a system feedback. The input 166 may receive a signal that may be a feedback of the outputs A and B. The output 168 may present the signals INC and DECB to the section 14a and the output 170 may present the signals INC and DECB to the section 14b. The signals INC and DECB presented to the section 14a and the signals INC and DECB presented to the section 14b may be the same signals or may be different signals, depending on the signals received at the inputs 162, 164 and 166.

The circuit 10 may be used to drive an output driver circuit, such as the output driver that may be found in co-pending application "LOW SPEED DRIVER FOR USE WITH THE UNIVERSAL SERIAL BUS", Ser. No. 08/828, 537, Filed Mar. 31, 1997, which is hereby incorporated by reference in its entirety. The relative delay of the two inputs (e.g., the signal A and the signal B generated by the circuit 10) may be important for final output signal adjustment. In such an example, changing only the relative delay (and hence crossover point) of the inputs, without significantly altering the rise and fall times of the inputs, may provide a successful operation of the output driver.

Additionally, the circuit 10 may be used directly as an output buffer, where careful control of the crossover point of the two outputs (e.g., the signals A and B) may be an important system parameter (such as in Universal Serial Bus systems). When the circuit 10 is used as an output buffer, the ability to adjust the crossover point of the output signals A and B may be necessary to overcome variations in circuit processing or output loading.

The variable delay elements 14a and 14b generally provide a delay that may depend on the setting of the control signals INC and DECB. The input 162 may be configured to accept input from a variety of external devices. In one example, a fixed input or 'trim' may be made based on a one-time measurement of circuit performance. In another example, the signals INC and DECB may be updated continuously based on system feedback received at the inputs 164 and 166. The signals INC and DECB may be, in one example, adjusted during the edge transitions of the signals A and B, in response to a feedback from the output signals A and B. One example of a circuit for providing such a feedback may be found in the common-mode detection circuit found in co-pending application "DYNAMIC SLEW RATE CONTROL OUTPUT BUFFER", Ser. No. 09/167, 799, Filed Oct. 7, 1998, which is hereby incorporated by reference in its entirety.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:

an input circuit configured to generate a differential signal in response to a single ended signal; and a first adjustable delay configured to both (i) delay or not change a rising edge and (ii) delay or not change a falling edge of a first portion of the differential signal, said first adjustable delay configured to control a crossover voltage of said differential signal in response to a feedback of said differential signal.

2. The circuit according to claim 1, further comprising:

a second adjustable delay configured to both (i) delay or not change a rising edge and (ii) delay or not change a falling edge of a second portion of the differential signal, said second adjustable delay further configured to control said crossover voltage of said differential signal in response to a feedback of said differential signal.

3. The circuit according to claim 1, wherein the differential signal is presented to an output buffer in a Universal Serial Bus device.

4. The circuit according to claim 2, further comprising:

a squaring circuit configured to provide an improved differential alignment between the first and second portions of the differential signal.

5. The circuit according to claim 1, wherein said input circuit comprises a first path and a second path, wherein said first path comprises an even number of inverters and said second path comprises an odd number of inverters.

6. The circuit according to claim 4, wherein said squaring circuit comprises a plurality of transistors.

7. The circuit according to claim 2, wherein:

said first adjustable delay (i) delays said rising edge of said first portion of said differential signal in response to a first control signal and (ii) delays said falling edge of said first portion of said differential signal in response to a second control signal, wherein said first and second control signals are generated in response to said feedback of said differential signal.

8. The circuit according to claim 7, wherein:

said second adjustable delay (i) delays said rising edge of said second portion of said differential signal in response to a third control signal and (ii) delays a falling edge of said second portion of said differential signal in response to a fourth control signal, wherein said third and fourth control signals are generated in response to said feedback of said differential signal.

9. The circuit according to claim 1, further comprising:

a logic circuit configured to control said crossover voltage in response to said feedback of said differential signal.

10. The circuit according to claim 1, further comprising:

a logic circuit configured to generate one or more control signals to control said first and second adjustable delays in response to said feedback of said differential signal.

11. A circuit comprising:

means for generating a differential signal in response to a single ended signal; and means for adjusting said differential signal to both (i) delay or not change a rising edge and (ii) delay or not change a falling edge of a first portion of the differential signal, said adjusting means configured to control a crossover voltage of said differential signal in response to a feedback of said differential signal.

12. A method for adjusting a first and a second portion of a differential output signal comprising the steps of:

(a) generating said differential output signal in response to a single ended signal; and (b) adjusting said first portion of said differential output signal to both (i) delay or not change a rising edge and (ii) delay or not change a falling edge of said differential signal and controlling a crossover voltage of said differential signal in response to a feedback of said differential signal.

13. The method according to claim 12, further comprising the step of:

(c) adjusting said second portion of said differential output signal to both (i) delay or not change a rising edge and (ii) delay or not change a falling edge and controlling said crossover voltage in response to said feedback of said differential signal.

14. The method according to claim 12, wherein the differential signal is presented to an output buffer in a Universal Serial Bus device.

15. The method according to claim 12, wherein step (a) generates said differential signal in response to a first path and a second path, wherein said first path comprises an even number of inverters and said second path comprises an odd number of inverters.

16. The method according to claim 13, wherein:

step (b) delays said rising edge of said first portion of said differential signal in response to a first control signal; and step (c) delays said falling edge of said first portion of said differential signal in response to a second control signal.

17. The method according to claim 16, wherein:

step (b) delays said rising edge of said second portion of said differential signal in response to a third control signal; and step (c) delays said falling edge of said second portion of said differential signal in response to a fourth control signal.

18. The method according to claim 17, wherein said first, second, third and fourth control signals are generated in response to a control circuit.

19. The method according to claim 13, further comprising the step of:

(d) generating one or more control signals to control steps (b) and (c) in response to said feedback of said differential signal.

* * * * *